United States Patent
Gehring et al.

(10) Patent No.: US 11,108,314 B2
(45) Date of Patent: Aug. 31, 2021

(54) MAGNET HOLDER, SENSOR MAGNET ASSEMBLY, ELECTRIC MOTOR COMPRISING A SENSOR MAGNET ASSEMBLY, AND METHOD FOR PRODUCING A SENSOR MAGNET ASSEMBLY

(71) Applicant: Bühler Motor GmbH, Nuremberg (DE)

(72) Inventors: Nils Gehring, Herzogenaurach (DE);
Paul-Peter Golditz, Nuremberg (DE);
Peter Schneider, Schnaittach (DE);
Bertram Baudler, Nuremberg (DE);
Gerhard Mehl, Uttenreuth (DE);
Stephan Kach, Neunkirchen am Brand (DE)

(73) Assignee: BÜHLER MOTOR GMBH, Nuremberg (DE)

( * ) Notice: Subject to any disclaimer, the term of this patent is extended or adjusted under 35 U.S.C. 154(b) by 182 days.

(21) Appl. No.: 16/665,381

(22) Filed: Oct. 28, 2019

(65) Prior Publication Data
US 2020/0136487 A1   Apr. 30, 2020

(30) Foreign Application Priority Data
Oct. 29, 2018   (DE) .................... 10 2018 218 430.5

(51) Int. Cl.
*H02K 1/28* (2006.01)
*H02K 29/08* (2006.01)
(Continued)

(52) U.S. Cl.
CPC ........... *H02K 29/08* (2013.01); *H02K 11/215* (2016.01); *G01R 33/07* (2013.01)

(58) Field of Classification Search
CPC .... G01R 33/07; G01R 33/072; G01R 33/077; G01R 33/09; G01R 33/091; H02K 29/03;
(Continued)

(56) References Cited

U.S. PATENT DOCUMENTS

| 2010/0001719 | A1 | 1/2010 | Kikuchi et al. |
| 2016/0285331 | A1* | 9/2016 | Ichikawa ............... G01D 5/145 |
| 2017/0346372 | A1* | 11/2017 | Yamamoto ........... H02K 11/215 |

FOREIGN PATENT DOCUMENTS

| DE | 10 2011 112 822 A1 | 3/2013 |
| DE | 10 2012 208 368 A1 | 11/2013 |

(Continued)

OTHER PUBLICATIONS

Search Report dated Aug. 8, 2019, issued in counterpart German Patent Application No. 10 2018 218 430.5 (5 pages).

*Primary Examiner* — Muhammad S Islam
(74) *Attorney, Agent, or Firm* — Westerman, Hattori, Daniels & Adrian, LLP

(57) ABSTRACT

A magnet holder for attaching a sensor magnet to a motor shaft of an electric motor, including a receiving recess for the sensor magnet and an attachment region for attachment to the motor shaft, wherein the receiving recess is radially delimited by a wall that, over the circumference thereof, includes a plurality of weak spots which have a reduced wall thickness and are designed so that free spaces remain between the weak spots and the sensor magnet arranged in the receiving recess. The invention further relates to a sensor magnet assembly, to an electric motor comprising a sensor magnet assembly, and to a method for producing a sensor magnet assembly. It is the object of the present invention to very reliably and durably attach a sensor magnet to the end of a motor shaft in a very economical and simple manner, wherein adhesive methods are to be dispensed with.

18 Claims, 3 Drawing Sheets

(51) Int. Cl.
*H02K 11/215* (2016.01)
*G01R 33/07* (2006.01)

(58) Field of Classification Search
CPC ........ H02K 29/08; H02K 29/10; H02K 29/12; H02K 29/14; H02K 11/21; H02K 11/215; H02K 11/24–27
See application file for complete search history.

(56) References Cited

FOREIGN PATENT DOCUMENTS

| | | |
|---|---|---|
| DE | 102 62 404 B3 | 2/2016 |
| DE | 10 2015 017 076 A1 | 9/2016 |
| WO | 2017/131296 A1 | 8/2017 |

\* cited by examiner

MAGNET HOLDER, SENSOR MAGNET ASSEMBLY, ELECTRIC MOTOR COMPRISING A SENSOR MAGNET ASSEMBLY, AND METHOD FOR PRODUCING A SENSOR MAGNET ASSEMBLY

CROSS-REFERENCE TO RELATED APPLICATIONS

The present patent application is based on, and claims priority from, German Application No. DE 10 2018 218 430.5, filed Oct. 29, 2018, which is incorporated herein by reference in its entirety.

BACKGROUND OF THE INVENTION

(1) Field of the Invention

The invention relates to a magnet holder for attaching a sensor magnet to a motor shaft of an electric motor. The invention further relates to a sensor magnet assembly, to an electric motor comprising a sensor magnet assembly, and to a method for producing a sensor magnet assembly.

(2) Description of Related Art Including Information Disclosed Under 37 CFR 1.97 and 1.98

A magnet holder of the type in question, a sensor magnet assembly and an electric motor comprising the sensor magnet assembly are known from WO 2017131296 A1. In this case, the sensor magnet is rectangular, in particular square, and is inserted into a recess of a magnet holder. The sensor magnet is glued in for attachment. Adhesive methods have a number of disadvantages. Shearing forces, such as are caused, for example, by different thermal expansion or shrinkage processes, must not be applied to adhesive bonds. The handling of adhesives, dosing and storage are generally problematic and should be avoided where possible. The known magnet holder also has a very complex design and requires a lot of installation space.

Another option for attaching a sensor magnet is known from DE 102 62 404 B3. Here, a sensor magnet is fixed by heat staking a plastic carrier. However, this solution is not sufficiently robust and durable.

BRIEF DESCRIPTION OF THE INVENTION

The invention relates to a magnet holder for attaching a sensor magnet to a motor shaft of an electric motor, including a receiving recess for the sensor magnet and an attachment region for attachment to the motor shaft, wherein the receiving recess is radially defined by a wall that, over the circumference thereof, includes a plurality of weak spots which have a reduced wall thickness and are designed in such a way that free spaces remain between the weak spots and the sensor magnet arranged in the receiving recess. The invention further relates to a sensor magnet assembly, to an electric motor comprising a sensor magnet assembly, and to a method for producing a sensor magnet assembly.

It is an object of the present invention to very reliably and durably attach a sensor magnet to the end of a motor shaft in a very economical and simple manner, wherein adhesive methods are to be dispensed with. A very reliable and durable connection is provided by the form fit in multiple locations of the wall, which has a greater wall thickness in these locations.

In a particularly preferred development of the invention, the magnet holder is made of a sintered material, in particular a sintered brass. Very precise components can be produced economically with the aid of sintering methods. In the present invention, it is also important that the magnet holder is non-magnetic; this can be achieved, for example, by the use of sintered brass. In the present invention, it is not possible to tolerate any major protrusions in both the axial and radial directions, because this would entail an increase in the air gap as well as space problems. Mechanical deformation of sintered material is difficult under these conditions and results in material failures when using conventional means and methods.

Due to the risk of breakage, it has been proposed for the weak spots have a minimum wall thickness of no more than 1 mm, preferably no more than 0.8 mm. This wall thickness is just barely still producible in the case of sintered brass parts. This design makes it easier to deform sintered parts; however, this comes at the expense of robustness and durability.

Surprisingly, the properties of the weak spots have been successfully combined with those of the adjacent wall regions having a greater wall thickness, so that a joint that is simple and reliable to produce and that additionally is very strong and provides a long service life is possible. To this end, it is provided that the sensor magnet is rectangular, and the weak spots are located opposite the corners or rounded corners of the sensor magnet, and the form fit is formed by spatially delimited sections of the wall on both sides of the weak spots.

So as to be able to establish a form fit, the wall has to protrude axially over rounded edges of the sensor magnet. If possible, the wall should also protrude slightly over the planar surface of the sensor magnet.

A particularly economical production of the magnet holder is possible if undercuts in the receiving recess for fixing the sensor magnet in a form-locked manner can be dispensed with. This is because undercuts cannot be created when metal powder is pressed.

It is provided that the attachment region has a bushing-shaped design and is pressed onto the motor shaft or a projection of the motor shaft. The intended sintered material is very well suited for this purpose.

An opening is formed between the attachment region and the receiving recess. This serves as a vent opening during pressing. The air can also escape through the free spaces on the corners. Depending on the diameter of the vent opening, an inner connection is already present between these ventilation paths. Otherwise, additional recesses in the bottom of the receiving recess can ensure sufficient venting.

The sensor magnet includes one or two pole pairs. So as to be able to derive the magnetic orientation based on geometric conditions, it is provided that the outer contour of the magnet holder has a polygonal geometry, in particular a tetragonal geometry.

The object of the invention is also achieved by a sensor magnet assembly, comprising the magnet holder and the sensor magnet, which is exclusively held in the receiving recess of the magnet holder in a form-locked manner by wall sections of the wall on both sides of the weak spots. A further solution is an electric motor comprising a sensor magnet assembly, wherein the sensor magnet assembly is arranged so as to axially adjoin the end face of the motor shaft.

Finally, the object is also achieved by a method for producing a sensor magnet assembly. The method steps are as follows: a) providing a sintered magnet holder; b) providing a rectangular sensor magnet; c) inserting the magnet holder and the sensor magnet into a pressing device comprising four pressing jaws; d) applying the pressing jaws to a respective weak spot of the wall opposite the corners of the sensor magnet; e) applying a pressing pressure to the weak spots with little advance; f) retracting the pressing jaws; and g) removing the sensor magnet assembly from the pressing device. This method partially compacts but also partially deforms the sintered material, wherein a sufficient form fit is created in regions of the wall having a greater wall thickness than at the weak spots. Sufficient strength and durability are thus achieved.

An optimal arrangement of the pressing jaws is provided by applying them to the weak spots at an angle in the range of 10 to 45°, preferably in the range of 15 to 30°, preferably at an angle of 20°, with respect to the longitudinal axis of the sensor magnet assembly. In this way, the wall can be deformed particularly easily.

BRIEF DESCRIPTION OF THE SEVERAL VIEWS OF THE DRAWINGS

An exemplary embodiment of the invention is explained in more detail below with reference to the drawings. The following is shown.

DETAILED DESCRIPTION OF THE INVENTION

Figure 1:
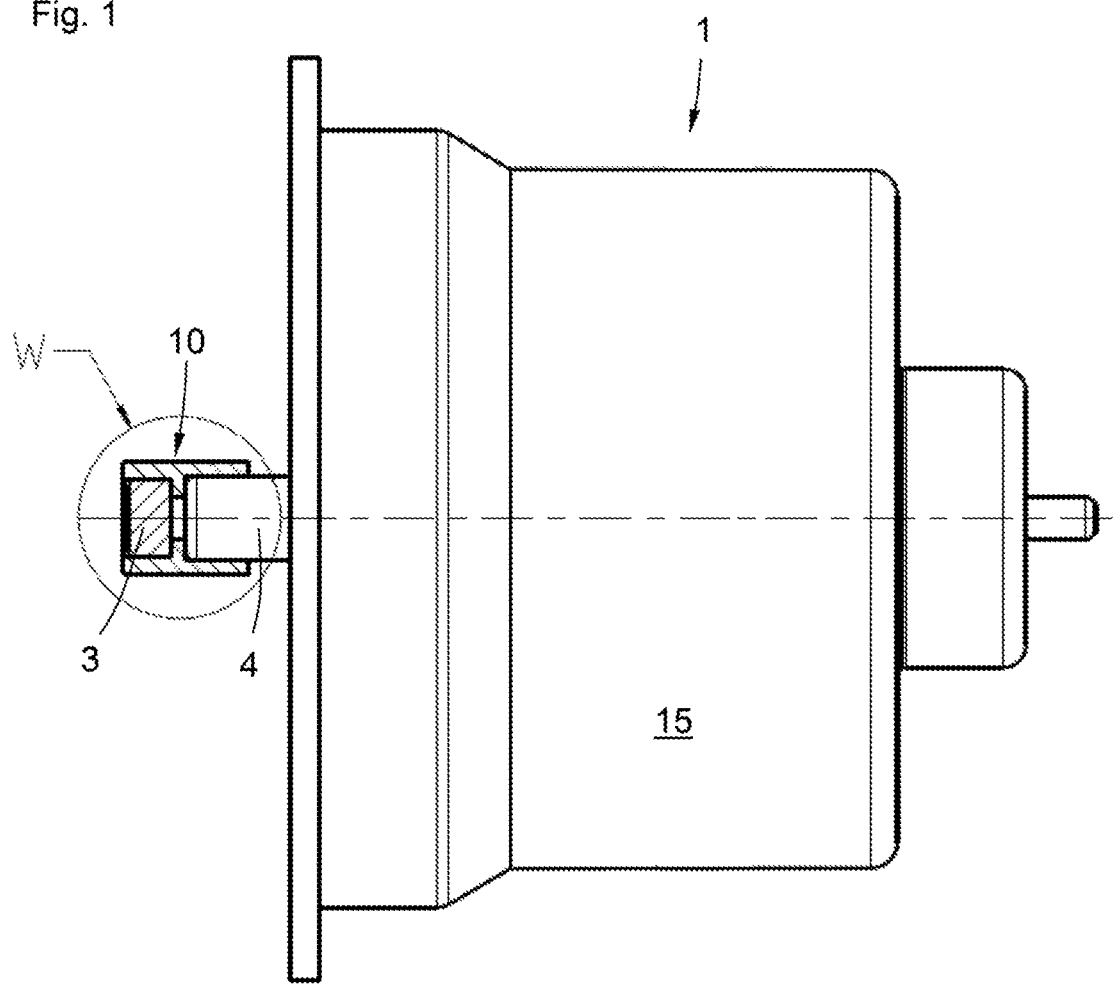
FIG. 1 shows an open electric motor including a sensor magnet assembly according to the invention.

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

FIG. 1 shows an open electric motor 1 comprising a motor housing 15, a motor shaft 4 projecting out of the housing, and a sensor magnet assembly 10 composed of a magnet holder 2 and a sensor magnet 3 attached to the motor shaft 4.

Figure 2:
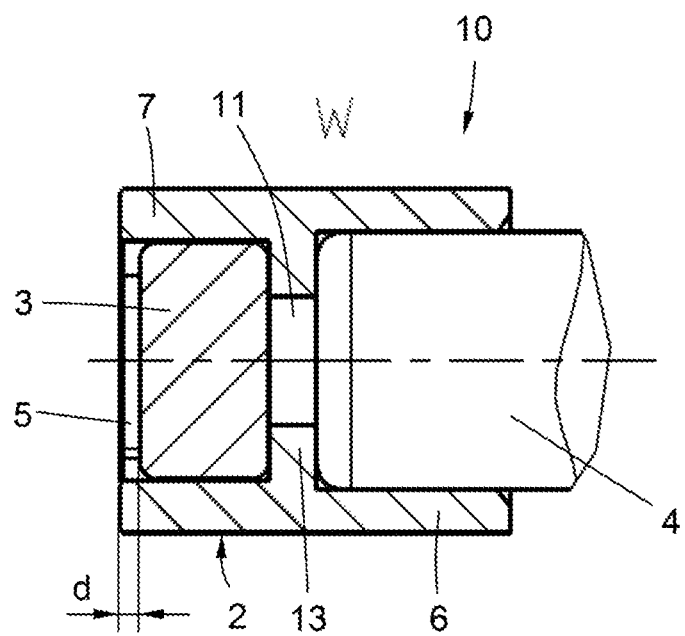
FIG. 2 shows an enlarged illustration of the sensor magnet assembly according to the invention.

FIG. 2 shows an enlarged illustration of the sensor magnet assembly 10 (Detail W), including the magnet holder 2, the sensor magnet 3, and the motor shaft 4. The sensor magnet 3 is accommodated in a receiving recess 5 of the magnet holder 2 and is pressed with a bushing-shaped attachment region 6 onto the motor shaft 4. In order to define the press-in depth of the magnet holder 2 on the one hand and the installation depth of the sensor magnet 3 on the other hand, a stop 13 is provided, which separates the two areas from one another. The stop 13 has a central opening 11 to allow the air trapped in the attachment region 6 to escape when the magnet holder 2 is pressed on. The receiving recess 5 is radially delineated by a circumferential wall 7. The magnet holder 2 is shown here in a sectional view in an undeformed area. In this area, the wall 7 is thick-walled. The wall 7 protrudes over the sensor magnet 3 by an amount d. The greater the rounding radii of the corners and edges of the sensor magnet 3 are, the lower the protrusion d of the wall 7 can be. The protrusion d can even be zero.

Figure 3:
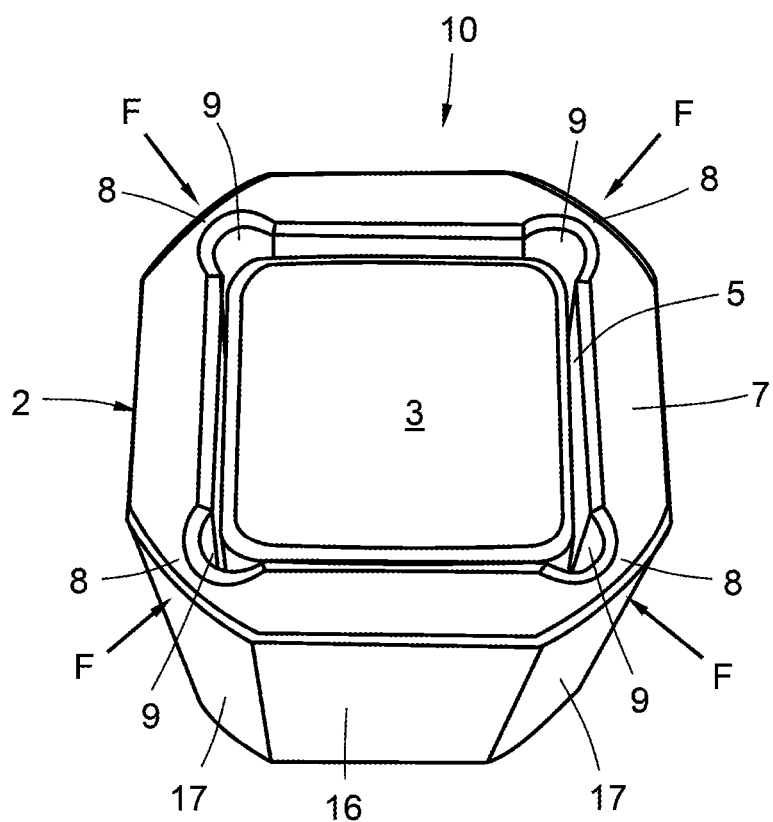
FIG. 3 shows an inventive magnet holder prior to deformation.

FIG. 3 shows the magnet holder 2 with the sensor magnet 3 accommodated in the receiving recess 5 prior to a deformation of the wall 7 of the receiving recess 5. The basic shape of the sensor magnet is square and cuboid. The corners and edges of the sensor magnet are rounded. The edges of the wall 7 are provided with a chamfer. The outer contour of the magnet holder 2 is adapted to the shape of the sensor magnet 3 and provided with four outer surfaces 16 oriented at right angles with respect to one another. Transition regions 17 between the outer surfaces 16 are curved. The wall 7 is designed in the transition regions 17 in the form of weak spots 8. On the side facing the sensor magnet 3, the weak spots 8 are delineated by free spaces 9 having a quadrant cross-sectional shape. The radius of the quadrant minimizes the notch effect during deformation and thus the risk of breakage. Arrows F indicate the direction of force under which deformation forces according to the invention are exerted.

Figure 4:
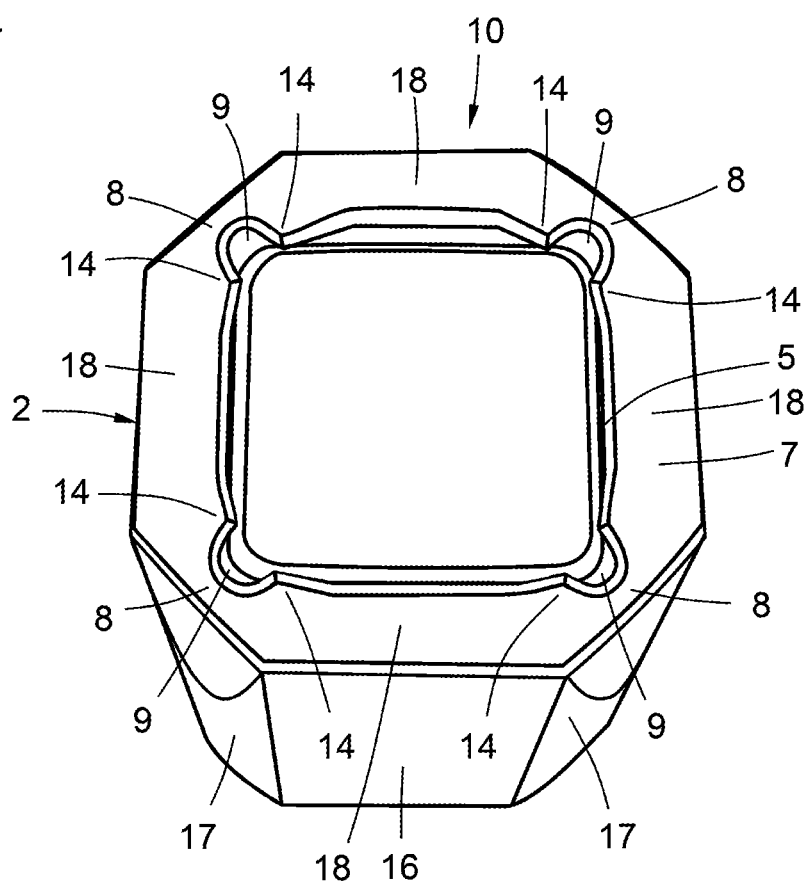
FIG. 4 shows the magnet holder of FIG. 3 after the deformation.

FIG. 4 shows the magnet holder 2 after the deformation. Wall regions 14 on both sides of the weak spots 8 are deformed radially inwardly so as to protrude slightly over the sensor magnet 3 and form a form-locked connection. Intermediate regions 18 between the deformed wall regions 14 remain undeformed. The free spaces 9 are reduced by the action of force but are still present; they are additionally used for venting when the sensor magnet assembly 10 is pressed onto the motor shaft (not shown here).

Figure 5:
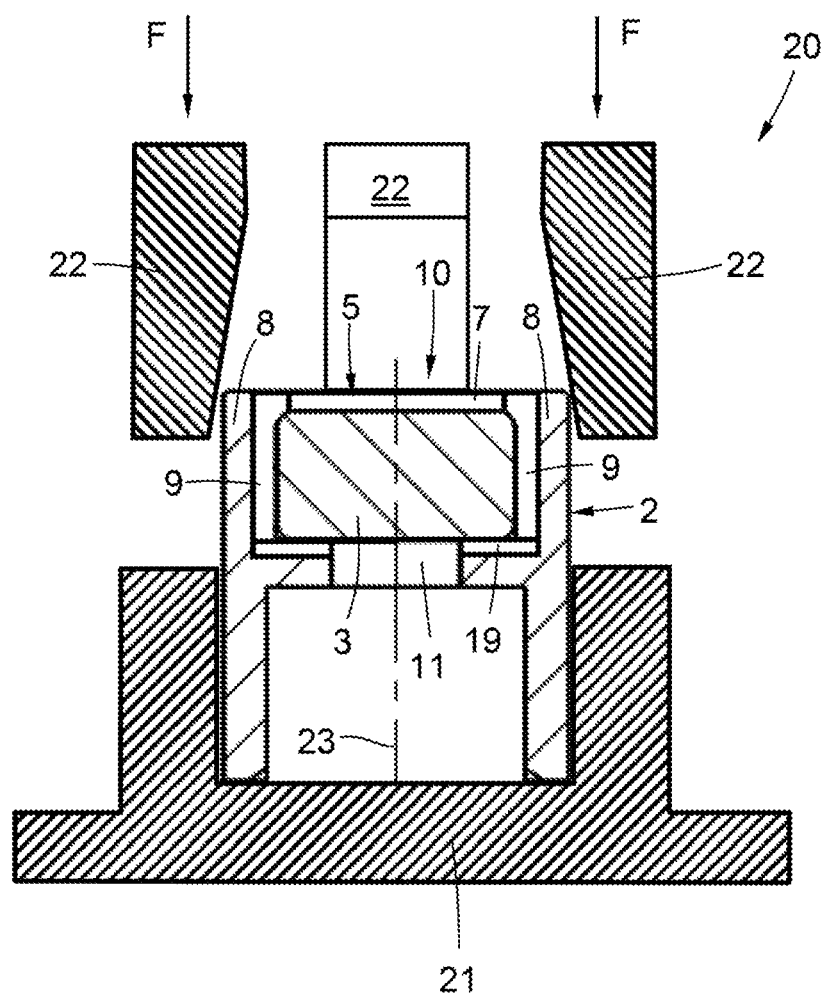
FIG. 5 shows a forming device for use in the inventive method.

FIG. 5 shows a forming device 20, comprising a receiving part 21 for receiving the sensor magnet assembly 10 and pressure jaws 22 for exerting a compressive force on the weak spots 8 of the wall 7 of the magnet holder 2. The pressure jaws have an inclination with respect to the center axis 23 of approximately 20°. In this way, small bending radii and thus risk of breakage are avoided. In this case, the sensor magnet assembly 10 is shown rotated by 45° in comparison to FIG. 2 so that the cut runs through the weak spots 8. The weak spots 8 are delimited by free spaces 9, which are pneumatically connected to the opening 11 via grooves 19 and serve as a ventilation path during pressing onto the motor shaft.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

LIST OF REFERENCE SYMBOLS

1 Electric motor
2 Magnet holder
3 Sensor magnet
4 Motor shaft
5 Receiving recess
6 Attachment region
7 Wall
8 Weak spot
9 Free space
10 Sensor magnet assembly
11 Opening 12 Edge
13 Stop
14 Wall region
15 Motor housing
16 Outer surface
17 Transition region
18 Intermediate region
19 Groove
20 Forming device
21 Receiving part
22 Pressure jaws

What is claimed is:

1. A magnet holder for attaching a sensor magnet to a motor shaft of an electric motor, the magnet holder comprising:
   a receiving recess for receiving the sensor magnet;
   an attachment region for attachment to the motor shaft;
   the receiving recess being radially delineated by a wall having a circumference;
   a plurality of weak spots over the circumference of the wall;
   the weak spots having a reduced wall thickness and being designed in such a way that free spaces remain between the weak spots and the sensor magnet when the sensor magnet is arranged in the receiving recess; and
   the sensor magnet being held in the receiving recess in a form-locked manner on both sides of the weak spots by wall regions having a larger wall thickness.

2. The magnet holder according to claim 1, the magnet holder being made of a magnetically non-conducting sintered metal.

3. The magnet holder according to claim 2, the magnetically non-conducting sintered metal comprising sintered brass.

4. The magnet holder according to claim 2, wherein the weak spots have a minimum wall thickness of no more than 1 mm.

5. The magnet holder according to claim 3, wherein the weak spots have a minimum wall thickness of no more than 0.8 mm.

6. The magnet holder according to claim 1, wherein the sensor magnet is rectangular and has four corners, and the weak spots are located opposite each of the corners of the sensor magnet, and the form fit is formed by spatially delineated sections of the wall on both sides of the weak spots.

7. Magnet holder according to claim 1, wherein the wall protrudes axially over rounded edges of the sensor magnet.

8. The magnet holder according to claim 1, wherein the receiving recess does not include any undercuts before the sensor magnet is installed.

9. The magnet holder according to claim 1, wherein the attachment region has a bushing-shaped design and is used for pressing onto the motor shaft or a projection of the motor shaft.

10. The magnet holder according to claim 9, further comprising an opening formed between the attachment region and the receiving recess.

11. The magnet holder according to claim 1, wherein an outer contour of the magnet holder has a polygonal geometry, in particular a tetragonal geometry.

12. The magnet holder according to claim 1, wherein the polygonal geometry is a tetragonal geometry.

13. Sensor magnet assembly according to claim 1, comprising the magnet holder and the sensor magnet, which is exclusively held in the receiving recess of the magnet holder in a form-locked manner by wall sections of the wall on both sides of the weak spots.

14. An electric motor comprising a sensor magnet assembly according to claim 1, wherein the motor shaft has an end face and the sensor magnet assembly is arranged so as to axially adjoin the end face of the motor shaft.

15. A method for producing a sensor magnet assembly according to claim 1, comprising the steps of:
   a) providing a sintered magnet holder;
   b) providing a rectangular sensor magnet;
   c) inserting the magnet holder and the sensor magnet into a pressing device comprising four pressing jaws;
   d) applying the pressing jaws to a respective weak spot of the wall opposite the corners of the sensor magnet;
   e) applying a pressing pressure to the weak spots with little advance;
   f) retracting the pressing jaws; and
   g) removing the sensor magnet assembly from the pressing device.

16. The method for producing a sensor magnet assembly according to claim 15, wherein the pressing jaws are applied to the weak spots at an angle in the range of 10 to 45° with respect to the longitudinal axis of the sensor magnet assembly.

17. The method for producing a sensor magnet assembly according to claim 15, wherein the pressing jaws are applied to the weak spots at an angle in the range of 15 to 30° with respect to the longitudinal axis of the sensor magnet assembly.

18. The method for producing a sensor magnet assembly according to claim 15, wherein the pressing jaws are applied to the weak spots at an angle of 20° with respect to the longitudinal axis of the sensor magnet assembly.

* * * * *